United States Patent [19]

Chen et al.

[11] 4,389,255

[45] Jun. 21, 1983

[54] METHOD OF FORMING BURIED COLLECTOR FOR BIPOLAR TRANSISTOR IN A SEMICONDUCTOR BY SELECTIVE IMPLANTATION OF POLY-SI FOLLOWED BY OXIDATION AND ETCH-OFF

[75] Inventors: Chau-Shiong Chen; Anant O. Dixit, both of San Diego, Calif.

[73] Assignee: Burroughs Corporation, Detroit, Mich.

[21] Appl. No.: 206,350

[22] Filed: Nov. 13, 1980

Related U.S. Application Data

[63] Continuation of Ser. No. 111,683, Jan. 14, 1980, abandoned, which is a continuation of Ser. No. 3,652, Jan. 15, 1979, abandoned.

[51] Int. Cl.$^3$ .................. H01L 21/265; H01L 21/225
[52] U.S. Cl. ..................... 148/1.5; 148/187; 357/91
[58] Field of Search .............. 148/1.5, 187; 357/91

[56] References Cited

U.S. PATENT DOCUMENTS

| | | | |
|---|---|---|---|
| 3,928,095 | 12/1975 | Harigaya et al. | 148/188 |
| 4,063,967 | 12/1977 | Graul et al. | 148/1.5 |
| 4,151,010 | 4/1979 | Goth | 148/1.5 |

*Primary Examiner*—Upendra Roy
*Attorney, Agent, or Firm*—Charles J. Fassbender; J. Ronald Richbourg; Kevin R. Peterson

[57] ABSTRACT

In the process of manufacturing integrated circuits, the steps of forming a layer of polysilicon, in which a dopant will be implanted, over an oxide mask having suitable windows to define zones of one conductivity type to be formed in a substrate of another conductivity type, driving the dopant from the polysilicon layer into the substrate to form the zones in the substrate, oxidizing the polysilicon layer so that the oxidized polysilicon layer and the mask become an integral layer, and then removing the integrated oxide layer. Thereafter, other layers may be formed on the substrate.

1 Claim, 6 Drawing Figures

METHOD OF FORMING BURIED COLLECTOR FOR BIPOLAR TRANSISTOR IN A SEMICONDUCTOR BY SELECTIVE IMPLANTATION OF POLY-SI FOLLOWED BY OXIDATION AND ETCH-OFF

This is a continuation, of application Ser. No. 111,683, filed Jan. 14, 1980, abandoned, which is a continuation of Ser. No. 003,652 filed on Jan. 15, 1979 abandoned.

BACKGROUND OF THE INVENTION

1. Field of Invention

This invention relates to integrated circuit processes and more particularly to a method of forming zones or junctions in the formation of transistors in the like.

2. Prior Art

In the manufacture of integrated circuits, the formation of certain zones, such as the buried collector, in the semiconductor substrate is conventionally formed by a diffusion or by an ion implantation process both of which tend to damage the surface of the substrate requiring a healing by a subsequent heat treatment before the manufacturing process can be completed. In the case of a buried collector, for example, a damage to the surface of the substrate must be healed before an epitaxial layer can be formed on the substrate.

The U.S. Patent to Graul et al U.S. Pat. No. 4,063,967 taught that the damage to a substrate surface can be eliminated by selectively positioning polycrystalline or amorphous, hereinafter called polysilicon, layers onto selected surface areas defined by windows in a mask, ion implanting a dopant into such layers and later diffusing the dopant from the layers into the selected areas on the semiconductor substrate. In the patented process, the patentee took advantage of the polysilicon layer by using it as an ohmic conductor complimenting the metallized material formed thereover and thus avoided any problem in removing the polysilicon layer.

In the manufacture of circuits the removal of the polysilicon layer is desirable, as for example in the formation of a buried collector zone, for the formation of the epitaxial layer over the semiconductor substrate to form the buried collector. This advantage of removing the polysilicon layer is not in the prior art.

Accordingly, it is a principal object of this invention to provide in the process of manufacturing integrated circuits the steps of forming and removing a polysilicon layer such that buried collector and other junctions may be formed in a substrate without damage to the surface.

SUMMARY AND ADDITIONAL ADVANTAGES OF THE INVENTION

The process of this invention which accomplishes the foregoing object comprises the steps of forming a layer of polysilicon in which a dopant will be implanted over an oxide mask which has suitable windows therein to define zones to be formed in a substrate, driving the dopant from the polysilicon layer into the substrate, oxidizing the polysilicon layer so that the polysilicon oxidized polysilicon layer and the mask become an integral layer, and then removing the integrated oxide layer. Thereafter, an epitaxial layer and other types of layers may be formed on the substrate.

From the foregoing, it can also be seen that one of the advantages in this process is the fact that the polysilicon layer and the mask are removed together as one layer and in the case of a buried collector, since the polysilicon layer overlies the entire substrate and mask, there is no problem of aligning a mask. That is not to say, however, that this process cannot be practiced by selectively placing the polysilicon layer on the mask and over the windows and removed after oxidation.

BRIEF DESCRIPTION OF THE PREFERRED EMBODIMENT

This invention is explained by way of forming a buried collector as one of the zones created in the manufacturing of an integrated circuit bipolar transistor. However, the process can be practiced on other types of zones and circuits such as forming source and drain zones in the FET field.

Figure 1:
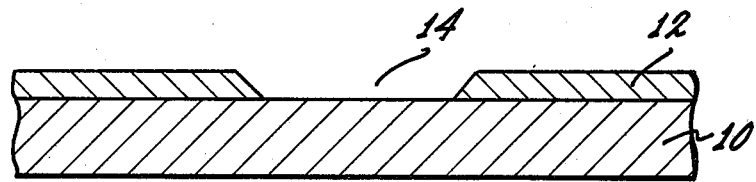
FIG. 1 is a partial cross-sectional view illustrating the semiconductor substrate with an overlying mask and window formed therein.
Figure 2:
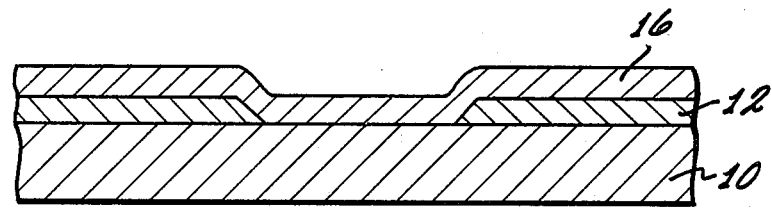
FIG. 2 illustrates the formation of a polysilicon layer over the mask and window.
Figure 3:
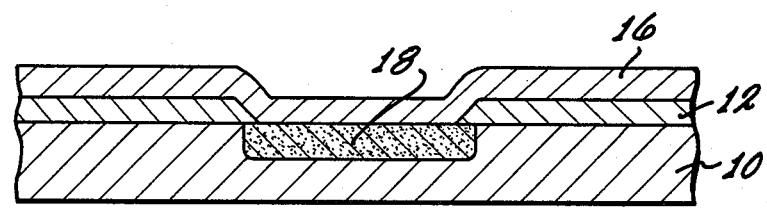
FIG. 3 illustrates the formation of the buried collector zone formed in the substrate of FIG. 1.

Turning now to FIG. 1, there is illustrated a substrate 10 of the P type on which is formed a mask 12 of oxide with a window 14. As shown in FIG. 2, a layer 16 of polysilicon is formed over the entire substrate including the window area 14. This layer 11 is implanted therein after the deposition of the layer.

In the next step of the process, the dopant ions in the polysilicon layer are driven by diffusion into the substrate 10 to form a collector 18 shown as the N+ type.

Figure 4:
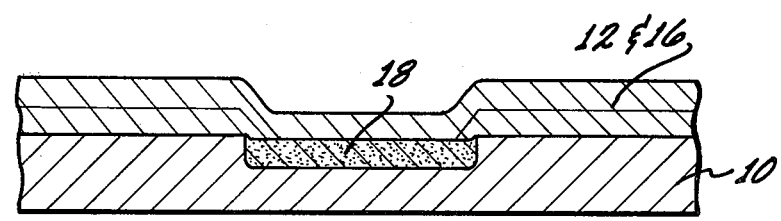
FIG. 4 demonstrates the formation of the polycrystalline layer integral with the mask.
Figure 5:
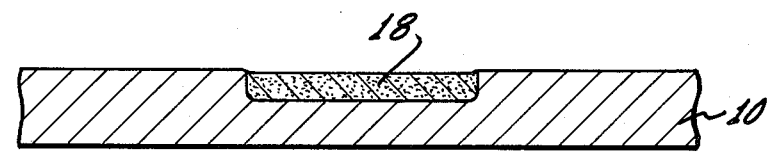
FIG. 5 shows the removal of the oxide layer with the collector zone exposed.
Figure 6:
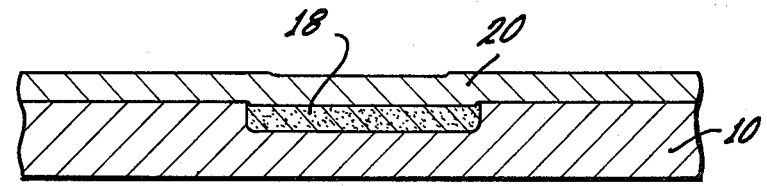
FIG. 6 illustrates an epitaxial layer formed on the substrate to form a buried collector.

Thereafter, the polysilicon layer 16 is oxidized so that the polysilicon layer and the oxide mask form one oxidized layer which is shown in the FIG. 4 drawing by a change in the cross-hatching from the cross-section of the polysilicon from the previous layers. Also, by this step, as shown by the cross-hatching in FIG. 4, a shallow surface portion of region 18 is oxidized. All of the resulting oxidized material as shown by the crosshatching is thereafter removed together as shown in FIG. 5 so that the entire surface of the substrate 10 is clear and free of any defects so that epitaxial layer 20 of the N type may be grown thereon as shown in FIG. 6. Thereafter, other elements of the transistor can be formed in a conventional way or the process repeated with another polysilicon layer over the mask to form the emitter and base junctions either by selectively applying the polysilicon layer or by covering the entire mask as above described.

What is claimed is:

1. A process for producing a buried collector for a bipolar transistor in a semiconductor body comprising:

applying a dopant impermeable oxide masking layer onto the surface of said semiconductor body, said masking layer having a window therein which exposes the surface of said substrate where said collector is to be fabricated;

applying a polysilicon layer uniformly over said masking layer and said exposed surface of said substrate;

implanting dopant ions into said polysilicon layer and thereafter diffusing said implanted dopant ions from said polysilicon layer through said window into a relatively deep region of said semiconductor body under said window;

oxidizing said polysilicon layer and a relatively shallow surface portion of said deep region into which said dopant ions diffused so as to form a single integrated oxide layer out of said masking layer and said polysilicon layer and said surface portion of said deep region; and removing said single integrated oxide layer in a single step while retaining the remaining portion of said deep region into which said dopant atoms diffused as said buried collector.

* * * * *